United States Patent [19]

Nagai

[11] Patent Number: 5,214,316
[45] Date of Patent: May 25, 1993

[54] POWER-ON RESET CIRCUIT DEVICE FOR MULTI-LEVEL POWER SUPPLY SOURCES

[75] Inventor: Nobutaka Nagai, Tokyo, Japan

[73] Assignee: NEC Corporation, Tokyo, Japan

[21] Appl. No.: 869,747

[22] Filed: Apr. 16, 1992

[30] Foreign Application Priority Data

Apr. 19, 1991 [JP] Japan .................................. 3-115562

[51] Int. Cl.$^5$ .......................... H03K 3/01; G06G 7/10
[52] U.S. Cl. .............................. 307/272.3; 307/296.4;
307/296.5; 307/491; 307/355; 307/356;
307/264; 307/592; 307/594
[58] Field of Search .......................... 307/296.4–296.5,
307/272.3, 491, 355–356, 264, 592, 594

[56] References Cited

U.S. PATENT DOCUMENTS 5,153,452 10/1992 Iwamura et al. .................. 307/296.4

FOREIGN PATENT DOCUMENTS 0114322 5/1987 Japan ................................. 307/272.2

*Primary Examiner*—Margaret R. Wambach

[57] ABSTRACT

A power-on reset circuit device has a first power-on reset circuit which outputs a first reset signal, when an external power supply voltage reaches a first reference voltage, for resetting a DC-DC converter for producing a plurality of internal power supply voltages; a second power-on reset circuit which outputs a second reset signal, when the internal power supply voltage produced by the DC-DC converter reaches a second reference voltage, for resetting an internal circuit; and transistor switches for respectively inactivating the first power-on reset circuit and fixing the level of the first reset signal in response to the second reset signal. Power consumed by the power-on reset circuit device can be kept low because, in response to the second reset signal, the first power-on reset circuit is inactivated by the second power-on reset circuit. The power-on reset circuit device can be formed by a small number of circuit components required.

4 Claims, 3 Drawing Sheets

POWER-ON RESET CIRCUIT DEVICE FOR MULTI-LEVEL POWER SUPPLY SOURCES

BACKGROUND OF THE INVENTION

(1) Field of the Invention

The present invention relates to a power-on reset circuit device and, more particularly, to a power-on reset circuit device which is capable of setting a power-on reset timing more than two times.

(2) Description of the Related Art

A conventional power-on reset circuit of the kind to which the present invention relates is shown in FIG. 1. The circuit has a series circuit of a diode group 10 and a resistor 11 connected between a power supply source $V_{CC}$ and a ground GND, which produces a reference voltage $V_3$ at a common junction node. The circuit also has a series circuit of a resistor 12 and a resistor 13 also connected between the power supply source $V_{CC}$ and the ground GND, which produces at a common junction node a divided voltage $V_2$ to be monitored. The circuit further has a comparator 14 which compares the divided voltage $V_2$ with the reference voltage $V_3$ and outputs a power-on reset signal $S_{RST}$.

The operation of the above circuit is explained with reference to FIG. 2. The reference voltage $V_3$ produced by the diode group 10 and the resistor 11 is 1.8 V ($=0.6$ V $\times$ 3) on the assumption that a forward-voltage $V_F$ of each diode is 0.6 V. To the comparator 14 are supplied this reference voltage $V_3$ and the divided voltage $V_2$, obtained with the power supply voltage $V_{CC}$ being divided by the resistors 12 and 13, which voltage increases with the rise of the power supply voltage $V_{CC}$. When the divided voltage $V_2$ becomes larger than the reference voltage $V_3$ ($=1.8$ V), an inversion of the output of the comparator takes place at the point A in FIG. 2. The power-on reset signal $S_{RST}$ thus obtained causes the internal circuit to turn from a set state to a reset state, thereby protecting the semiconductor device from a malfunction caused by a transitional condition at the rising, and causes it to operate normally thereafter.

In this conventional power-on reset circuit, since only one point (point A), that is, one kind of voltage is watched, it is effective only for one kind of power supply source. If, for instance, more than three kinds of power supply sources are used together for the same semiconductor device, there was a possibility of occurrence of abnormal waveforms of the output voltage in a power supply source where the power-on reset does not work, even though one kind of power supply voltage reaches the point A, because of the different rise time of each of the power supply sources.

In the case where two power-on reset circuits shown in FIG. 1 are adopted to apply the power-on resetting to the circuit which is operable under three different levels of power supply sources, although the possibility of occurrence of the abnormal waveforms of the output voltages becomes low, the problems of increasing the circuit current and the number of necessary components still remain because two circuits having the same circuit configuration but having different reference voltages are required. This is a problem to be solved in the conventional circuit.

SUMMARY OF THE INVENTION

It is, therefore, an object of the invention to overcome the problems existing in the conventional circuit and to provide an improved power-on reset circuit for multi-level power supply sources, in which power consumption thereby is kept low and the circuit can be constituted by a small number of components required.

According to one aspect of the invention, there is provided a power-on reset circuit device for resetting an internal circuit and a DC-DC converter circuit for producing an internal power supply voltage, the power-on reset circuit comprises:

a first power-on reset circuit which outputs a first power-on reset signal for resetting the DC-DC converter circuit when an external power supply voltage reaches a first reference voltage;

a second power-on reset circuit which outputs a second power-on reset signal for resetting the internal circuit when the internal power supply voltage produced by the DC-DC converter circuit reaches a second reference voltage; and switch means for stopping supplying of current to the first power-on reset circuit and for fixing a level of the first power-on reset signal in response to the second power-on reset signal.

BRIEF DESCRIPTION OF THE DRAWINGS

The above and other objects, features and advantages of the present invention will be apparent from the following description of preferred embodiments of the invention, with reference to the accompanying drawings, in which.

PREFERRED EMBODIMENTS OF THE INVENTION

Now, some embodiments of the invention will be explained with reference to the accompanying drawings.

Figure 1:
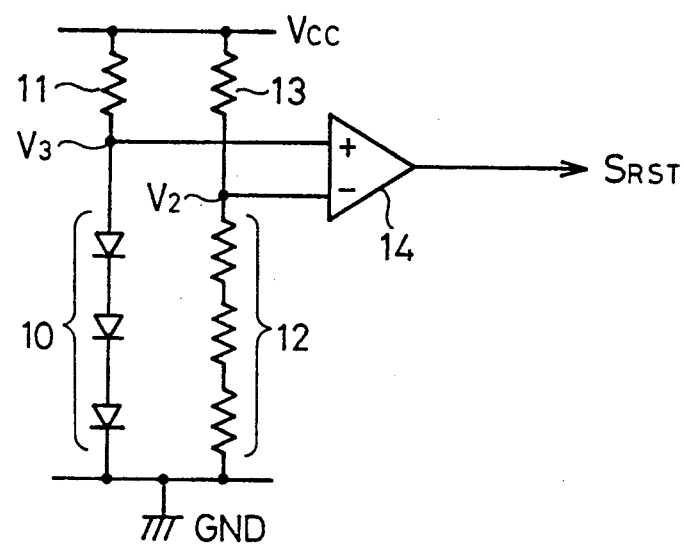
FIG. 1 is a circuit diagram of a conventional power-on reset circuit.
Figure 2:
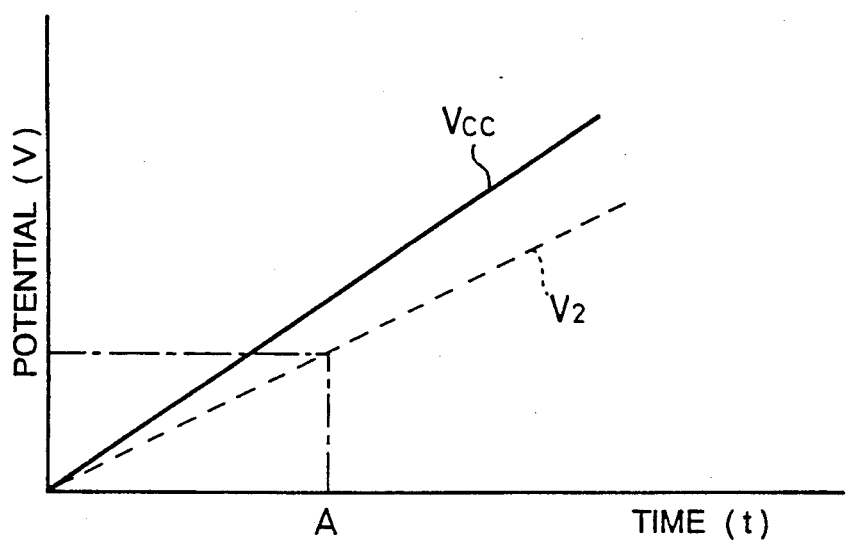
FIG. 2 is a timing chart showing the operation of the conventional power-on reset circuit.
Figure 3:
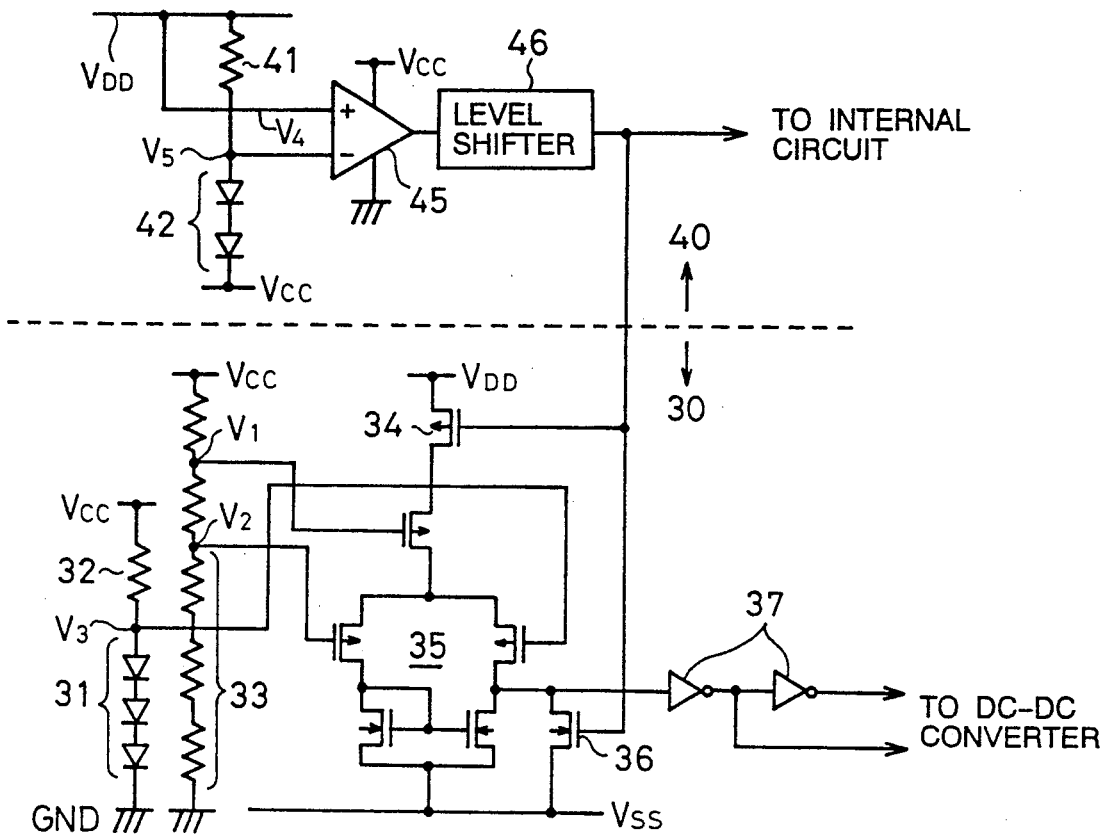
FIG. 3 is a circuit diagram of a power-on reset circuit of a first embodiment according to the present invention.

FIG. 3 is a circuit diagram showing a first embodiment according to the present invention. The power-on reset circuit device of this embodiment operates to reset the internal circuit of the semiconductor device operable under four-level power supply voltages which are produced by level-converting the $+5$ V power supply voltage ($V_{CC}$) into $+10$ V power supply voltage ($V_{DD}$) and $-10$ V power supply voltage ($V_{SS}$) with a DC-DC converter.

A power-on reset circuit 30 for the DC-DC converter is formed by a series circuit of a diode group 31 and a resistor 32, which produces a reference voltage $V_3$; a series resistor group 33 for producing a divided voltage $V_2$ which increases in accordance with the rise of the $+5$ V power supply voltage $V_{CC}$; a comparator circuit 35 to which the reference voltage $V_3$ and the divided voltage $V_2$ are inputted and which is constituted by an operational amplifier operable under $+10$ V power supply voltage ($V_{DD}$) and $-10$ V power supply voltage ($V_{SS}$) converted by the DC-DC converter; a comparator switch 34 for on-off controlling the comparator 35; an inverter input-level fixing switch 36 for fixing the output of the comparator 35 when the comparator 35 is controlled to its off-state; and serially connected two inverters 37.

On the other hand, a power-on reset circuit 40 for the internal circuits is formed by a series circuit of a resistor 41 and a diode group 42, which produces a reference voltage $V_5$; a comparator 45 to which the voltage $V_{DD}$ to be produced by the DC-DC converter and the reference voltage $V_5$ are inputted and which is operable under the power supply voltage $V_{CC}$; and a level shifter 46 for pulling-up the output level of the comparator 45 to the level of the voltage boosted up by the DC-DC converter.

Figure 5:
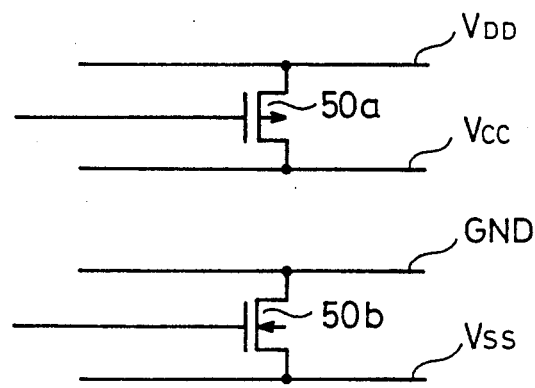
FIG. 5 is a circuit diagram of a reset-circuit in a DC-DC converter.

The output signal which is outputted from the comparator 45 and is further level-shifted by the level shifter 46 is inputted to the gate of the field effect transistor constituting the comparator switch 34 and also to the gate of the field effect transistor constituting the inverter input-level fixing switch 36. The output of the comparator 35 is inputted through the inverters 37 to the gates of the reset field effect transistors 50a and 50b, shown in FIG. 5, in the DC-DC converter circuit.

Next, the operation of the power-on reset circuit device of the above first embodiment will be explained with reference to FIG. 4. When the +5 V power supply voltage $V_{CC}$ is supplied to the circuit, the potential of the $V_{CC}$ power supply source rises toward 5 V. For instance, if the reference voltage $V_3$ and the other divided voltage $V_2$ both inputted to the comparator 35 are set to 1.8 V and $3/5 \times V_{CC}$, respectively, when the potential of the power supply voltage $V_{CC}$ reaches 3 V (the point A in FIG. 4), an inversion of the output of the comparator 35 takes place and the DC-DC converter is reset accordingly. Thus, the DC-DC converter starts its operation and the +10 V power supply voltage $V_{DD}$ begins to increase in its potential.

Next, if the reference voltage $V_5$ and the other compared voltage $V_4$ both inputted to the comparator 45 are set to ($V_{CC}+V_F \times 2$) and $V_{DD}$, respectively, when the increased $V_{DD}$ becomes higher than $V_{CC}$ by about 1.2 V (the point B in FIG. 4), an inversion of output of the comparator 45 takes place, and this output signal from the comparator 45 is increased in its level by the level shifter 46. Thus, the internal circuits concerned are reset accordingly.

On the other hand, the high level output from the level shifter 46 causes the comparator transistor-switch 34 to be non-conductive so that the comparator 35 becomes an off-state, and it causes the inverter input-level fixing transistor-switch 36 to be conductive so that the output level of the comparator 35 is fixed to a low level.

Figure 4:
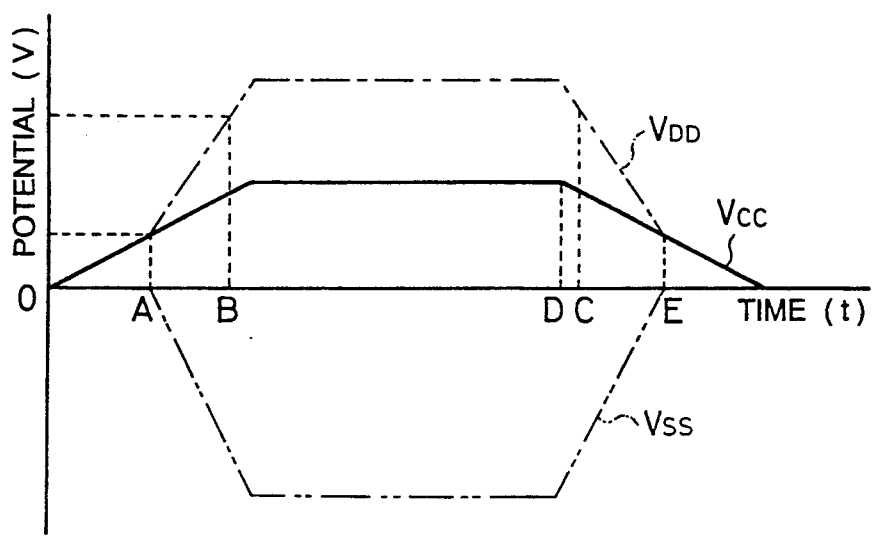
FIG. 4 is a timing chart showing the operation of the power-on reset circuit of the first embodiment shown in FIG. 3.

Contrary to the above, in the case where the +5 V power supply source $V_{CC}$ is to be off at the point D in FIG. 4, when the potential of the voltage $V_{DD}$ becomes lower than ($V_{CC}+1.2$ V) as shown as the point C in FIG. 4, an inversion of the output of the comparator 45 takes place and thus the internal circuits concerned are set. In this case, the comparator switch 34 for the comparator 35 is turned-on and the inverter input-level fixing switch 36 is turned-off. When the potential of the power supply voltage $V_{CC}$ becomes lower than 3 V (the point E in FIG. 4), an inversion of the output of the comparator 35 takes place and thus the DC-DC converter circuit is set.

In this way, the one power-on reset circuit 30 for the DC-DC converter functions as the first power-on reset circuit and the other power-on reset circuit 40 for the internal circuits functions as the second power-on reset circuit. The transistor switches 34 and 36 respectively constitute the means for inactivating the first power-on reset circuit 30 and the means for fixing the output of the first power-on reset signal.

Figure 6:
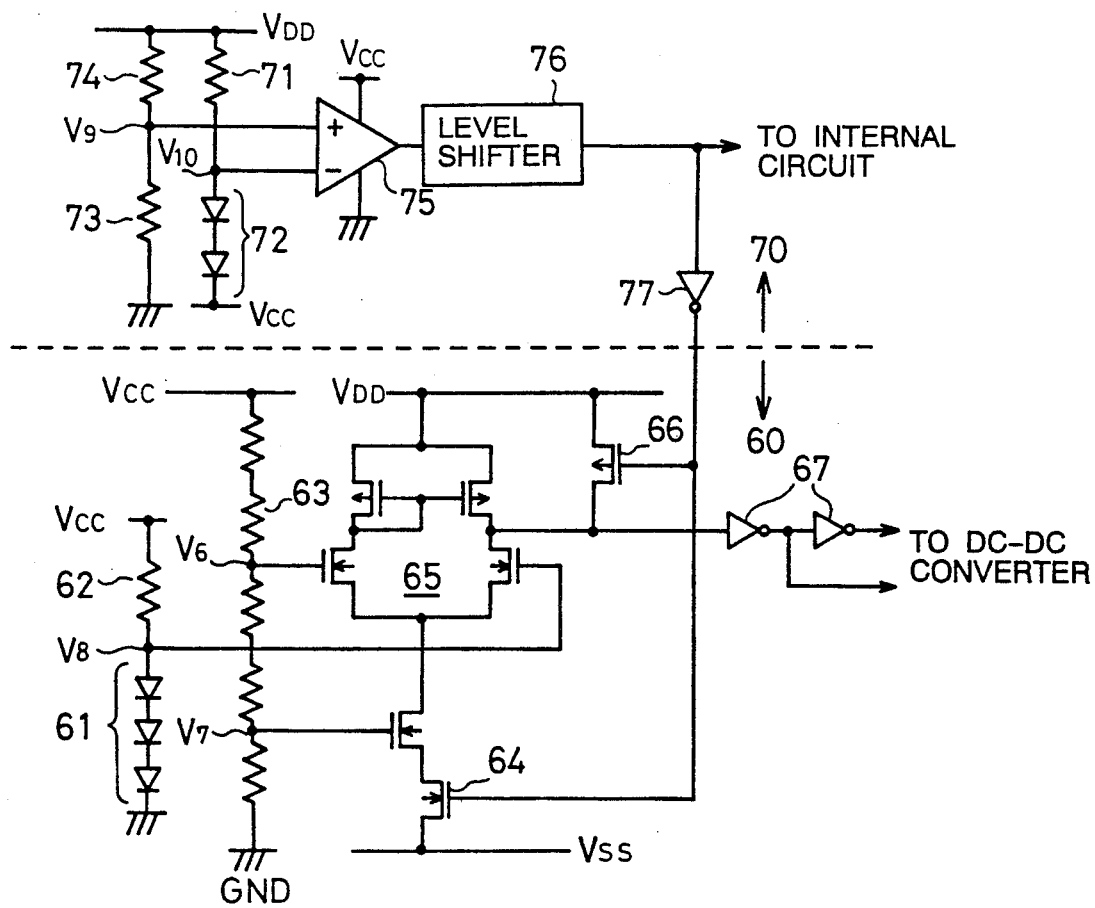
FIG. 6 is a circuit diagram of a power-on reset circuit of a second embodiment according to the present invention.

Next, a power-on reset circuit device of a second embodiment according to the invention will be explained with reference to FIG. 6.

The overall circuit device of this embodiment is also formed by a first power-on reset circuit 60 and a second power-on reset circuit 70.

The first power-on reset circuit 60 for the DC-DC converter is formed by a series circuit of a diode group 61 and a resistor 62, which produces a reference voltage $V_8$; a series resistor group 63 for producing a divided voltage $V_6$ which increases in accordance with the rise of the $V_{CC}$ power supply source; a comparator 65 which receives the reference voltage $V_8$ and the divided voltage $V_6$ and which operates under the +10 V power supply voltage ($V_{DD}$) and $-10$ V power supply voltage ($V_{SS}$); a transistor switch 64 for on-off controlling the comparator 65; and a transistor switch 66 for fixing the input-level to the following two serially connected inverters 67.

The second power-on reset circuit 70 for the internal circuits is formed by a series circuit of a diode group 72 and a resistor 71 for producing a reference voltage $V_{10}$; a series circuit of a resistor 73 and a resistor 74 for producing a divided voltage $V_9$ which changes in accordance with an increase in the voltage $V_{DD}$ boosted by the DC-DC converter; a comparator 75 which receives the reference voltage $V_{10}$ and the divided voltage $V_9$ and which operates under the $V_{CC}$ power supply source; and a level shifter 76 for pulling up the output voltage from the comparator 75 to the voltage which is boosted by the DC-DC converter. To the respective gates of the comparator switch transistor 64 and the inverter input-level fixing switch transistor 66 are inputted the output signal of the level shifter 76 through an inverter 77.

The circuit device of the above second embodiment operates in the same way as that of the first embodiment. First, when the potential of the $V_{CC}$ power supply source reaches around 3 V, the power-on reset circuit 60 operates to reset the DC-DC converter circuit. Thereafter, the potential of the $V_{DD}$ power supply source increases and it nearly reaches ($V_{CC}+1.5$ V), the internal circuits concerned are reset and, at the same time, the comparator 65 for the DC-DC converter which comparator has previously operated is turned-off and the input level applied to the inverters 67 from the comparator 65 is fixed.

As has been explained hereinabove, though the circuit according to the invention uses two power-on reset circuits one for resetting the internal circuits and the other for resetting the DC-DC converter circuit, the power consumption thereby can be kept low because the former power-on reset circuit causes the latter power-on reset circuit to be inactivated or turned off after certain conditions are once satisfied.

The circuit device can also achieve the effect that the occurrence of abnormal output waveforms is effectively prevented from being outputted from the circuit which is operable under multi-level power supply sources whose rising timings are different from each other.

Even though some power is consumed in the power-on reset circuit for the DC-DC converter circuit, as this power-on reset circuit is caused to be inactivated or turned off by the other power-on reset circuit for internal circuits, it is possible to form the overall power-on reset circuit device for the multi-level power supply sources without using the shift registers, thereby reducing the number of components or elements required.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A power-on reset circuit device for multi-level power supply sources comprising:
   a first power-on reset circuit which outputs a first power-on reset signal when an external power supply voltage externally supplied reaches a first reference voltage;
   a second power-on reset circuit which outputs a second power-on reset signal when an internal power supply voltage reaches a second reference voltage; and
   switch means for inactivating said first power-on reset circuit and for fixing a level of said first power-on reset signal in response to said second power-on reset signal.

2. A power-on reset circuit device for resetting internal circuits and an internal power supply voltage generating circuit (DC-DC converter circuit) for producing an internal power supply voltage, said power-on reset circuit comprising:
   a first power-on reset circuit which outputs a first power-on reset signal for resetting said internal power supply voltage generating circuit when an external power supply voltage reaches a first reference voltage;
   a second power-on reset circuit which outputs a second power-on reset signal for resetting said internal circuits excluding said internal power supply voltage generating circuit when said internal power supply voltage produced by said internal power supply voltage generating circuit reaches a second reference voltage; and
   switch means for stopping supplying of current to said first power-on reset circuit and for fixing a level of said first power-on reset signal in response to said second power-on reset signal.

3. A power-on reset circuit device according to claim 1, wherein said first power-on reset circuit includes a first reference voltage generating circuit for producing said first reference voltage from said external power supply voltage; a resistor network for producing a first monitored voltage which increases in accordance with an increase in said external power supply voltage; and a first comparator which compares said first reference voltage and said first monitored voltage and outputs said first power-on reset signal, and wherein said second power-on reset circuit includes a second reference voltage generating circuit for producing a second reference voltage from said internal power supply voltage produced by said internal power supply voltage generating circuit; a second comparator which compares said second reference voltage and said internal power supply voltage; and a level shifter for level-shifting the level of an output from said second comparator to the level of said internal power supply voltage produced by said internal power supply voltage generating circuit.

4. A power-on reset circuit device according to claim 3, wherein said internal power supply voltage generating circuit produces first and second internal power supply voltages at first and second internal power supply lines, respectively, and wherein said switch means includes a first switching transistor connected between said first internal power supply line and said first comparator and includes a second switching transistor connected between said second comparator and said second internal power supply line.

* * * * *